(12) United States Patent
Kang et al.

(10) Patent No.: US 8,530,950 B1
(45) Date of Patent: Sep. 10, 2013

(54) METHODS AND STRUCTURES FOR SPLIT GATE MEMORY

(75) Inventors: Sung-Taeg Kang, Austin, TX (US); Cheong Min Hong, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/485,873

(22) Filed: May 31, 2012

(51) Int. Cl.
*H01L 29/76* (2006.01)

(52) U.S. Cl.
USPC ........... 257/314; 438/257; 438/201; 438/261; 438/591; 257/316; 257/325

(58) Field of Classification Search
USPC ................. 438/257, 201, 261, 591; 257/316, 257/325
See application file for complete search history.

(56) References Cited

U.S. PATENT DOCUMENTS

| | | | |
|---|---|---|---|
| 7,361,543 B2 * | 4/2008 | Steimle et al. ................. | 438/201 |
| 7,795,091 B2 * | 9/2010 | Winstead et al. ............. | 438/257 |
| 7,863,670 B2 | 1/2011 | Ishii et al. | |
| 8,034,670 B2 | 10/2011 | Phua et al. | |
| 8,035,155 B2 | 10/2011 | Sakai | |
| 8,048,738 B1 * | 11/2011 | Kang et al. .................... | 438/257 |
| 2002/0197790 A1 * | 12/2002 | Kizilyalli et al. ............. | 438/240 |
| 2009/0108325 A1 * | 4/2009 | Kang et al. ..................... | 257/316 |
| 2009/0111229 A1 * | 4/2009 | Steimle et al. ................ | 438/261 |
| 2010/0099246 A1 * | 4/2010 | Herrick et al. ................ | 438/591 |
| 2010/0244121 A1 * | 9/2010 | Loiko et al. .................... | 257/325 |

OTHER PUBLICATIONS

U.S. Appl. No. 13/248,549, Jinmiao J. Shen, "Split Gate Memory Device with Gap Spacer", filed Sep. 29, 2011.

* cited by examiner

*Primary Examiner* — Zandra Smith
*Assistant Examiner* — Sophia Nguyen
(74) *Attorney, Agent, or Firm* — Mary Jo Bertani; David G. Dolezal

(57) ABSTRACT

A split gate memory cell comprising a substrate including semiconductor material and a first gate structure of the memory cell located over the substrate. The first gate structure includes a first side wall having a lower portion and an upper portion. The upper portion is inset from the lower portion. A charge storage structure of the memory cell is located laterally to the first side wall. A second gate structure is located over the substrate and over at least a portion of the charge storage structure. The second gate structure is located laterally to the first gate structure such that the first side wall is located between the first gate structure and the second gate structure. A dielectric structure located against the upper portion of the first side wall and has a portion located over the lower portion of the first side wall.

20 Claims, 5 Drawing Sheets

METHODS AND STRUCTURES FOR SPLIT GATE MEMORY

BACKGROUND

1. Field

This disclosure relates generally to semiconductor devices, and more specifically, to split gate memory cells.

2. Related Art

Split gate devices, which include both a select gate and a control gate, are typically used as bitcell storage devices within nonvolatile memory arrays. The use of a separate select gate for the bitcells in such arrays allows for improved isolation and reduced bitcell disturb during programming and reading of the bitcells. In split gate memory cells, the gap region between select gate and control gate is a weak spot for voltage breakdown. The region is subjected to repeated high erase voltage during non-volatile memory cell operation.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of methods and semiconductor devices disclosed herein provide a split gate memory cell for a memory device that solves the problem of voltage breakdown in a gap between a select gate and a control gate by increasing the gap between the upper corner of the control gate and the split gate, and filling the increased gap with a high-quality dielectric. The increased gap distance and higher quality dielectric helps prevent voltage breakdown in the split gate memory cell.

Figure 1:
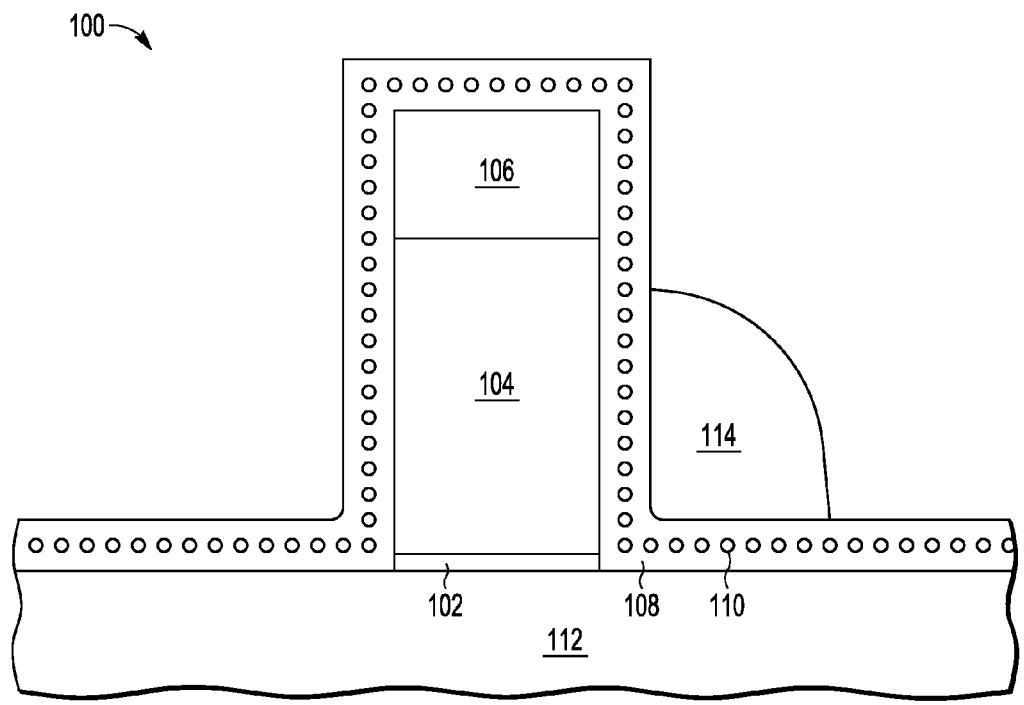
FIGS. 1-8 show a cross-sectional view of an embodiment of a split gate memory cell during successive stages of manufacture.

FIG. 1 shows a cross-sectional view of an embodiment of a semiconductor device 100 such as a split gate memory cell during an intermediate stage of manufacture in which a select gate structure includes gate dielectric layer 102, select gate layer 104, and dielectric layer 106 formed in layers on substrate 112. Dielectric layer 106 has a different etch selectivity than select gate 104 and charge storage layer 108 and can be silicon nitride, silicon oxynitride or other suitable material. Charge storage layer 108 is formed over the select gate structure and exposed portions of substrate 112 may have any suitable structure, for example, a continuous charge storage layer such as floating gate, or discrete storage layer including nanocrystals or silicon nitride. In alternate embodiments, charge storage layer 108 may include a single nitride layer, a trap oxide layer, or may include a stack of different layers. In the example shown, charge storage layer 108 is embedded with nanocrystals 110. Control gate 114 is formed on a portion of dielectric layer 110 adjacent to select gate 104.

Semiconductor substrate 112 described herein can be any semiconductor material or combinations of materials, such as gallium arsenide, silicon germanium, silicon-on-insulator (SOI), silicon, monocrystalline silicon, the like, and combinations of the above. Semiconductor substrate 112 may also be referred to as a semiconductor layer. Gate dielectric layer 102 is next to substrate 112. Select gate layer 104 is formed over the gate dielectric layer 102. Gate dielectric layer 102 may be any appropriate gate dielectric layer, such as, for example, a gate oxide layer. Select gate layer 104 may be a polysilicon gate layer. Alternatively, select gate layer 104 may also be a metal, titanium nitride, or a combination of materials. Select gate layer 104 can be formed using one or more dry etch steps such as a breakthrough etch of an anti-reflective coating and a main etch which etches through the material of select gate layer 104 (such as, for example, carbon fluoride, in the case that select gate layer 104 is polysilicon), the etch chemistry may also include an oxidizing agent. The oxidizing agent may include for example, oxygen ($O_2$) or helium oxide ($HeO_2$).

Charge storage layer 108 can be formed by growing an oxide on exposed portions of substrate 112 and along sidewalls of the select gate structure. In one embodiment, oxide is grown to a thickness in a range of approximately 4 to 10 nanometers. After formation of oxide, nanocrystals 110 and an insulating layer surrounding nanocrystals 110 are formed over oxide layer and select gate structure. In one embodiment, nanocrystals 110 have diameters in a range of approximately 3 to 20 nanometers. Conventional processing may be used to form nanocrystals 110. Nanocrystals 110 may include any type of conductive material, such as, for example, silicon, germanium, a metal, or the like. The insulating layer is formed over and surrounding nanocrystals 110, and, in one embodiment, is an oxide layer. Alternatively, the insulating layer may include hafnium oxide, aluminum oxide, etc. In one embodiment, the insulating layer has a thickness in a range of 8 to 20 nanometers. Therefore, note that oxide (over substrate 112), nanocrystals 110, and an insulating layer form charge storage layer 108. In one embodiment, charge storage layer 108 has a total thickness in a range of approximately 12 to 30 nanometers. Therefore, in one embodiment, charge storage layer 108 may be referred to as a thin storage layer which has a thickness of at most approximately 30 nanometers. Note that a portion of charge storage layer 108 is formed over substrate 112 and another portion of charge storage layer 108 is formed along the sidewalls of the select gate structure. Storage layer 108 could also be another storage material such as polysilicon surrounded by a dielectric or nitride. Nanocrystals 110 can also be called nanoclusters and are typically of silicon.

Control gate electrode 114 (also referred to as control gate 114) is formed adjacent to a sidewall of the select gate structure on substrate 112. Control gate electrode 114 may include polysilicon, a metal, titanium nitride, etc., or combinations thereof and can be formed using conventional deposition techniques such as by depositing a layer of polysilicon, which is conformal, and then performing an anisotropic etch on the conformal layer. The conformal layer should be either conductive or able to become conductive. In the case of polysilicon, the material is doped in order to be more conductive. The doping typically occurs by implants after deposition but could be by in situ doping or a combination of in situ doping and subsequent implants. The height of control gate 114 is less than the height of select gate 104.

Figure 2:
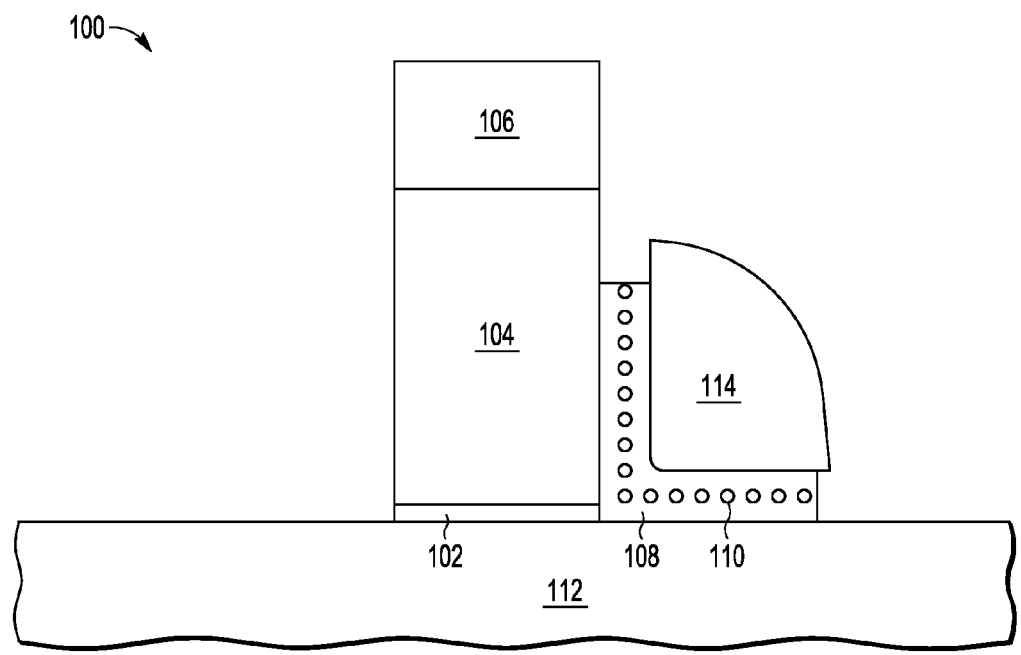
Figure 3:
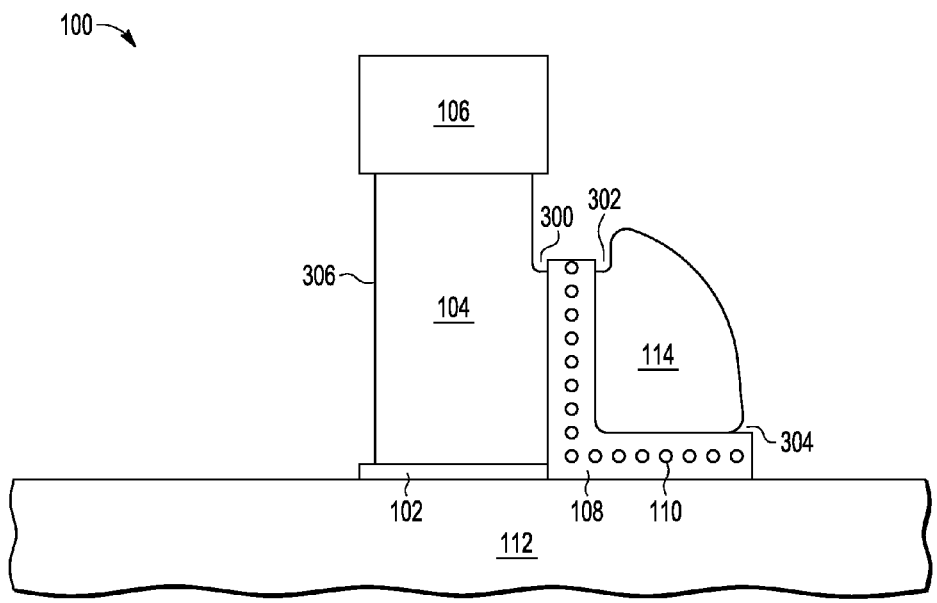

FIG. 2 shows a cross-sectional view of split gate memory cell 100 during a successive stage of manufacture in which an etch is performed to remove portions of charge storage layer 108, such that a portion of charge storage layer 108 remains between control gate electrode 114 and select gate structure and between control gate electrode 114 and substrate 112. In the vertical direction, the height of the remaining portion of charge storage layer 108 is less than the height of control gate 114 after the etch process. In the horizontal direction, the width of the remaining portion of charge storage layer 108 is less than the width of control gate 114 after the etch process FIG. 3 shows a cross-sectional view of split gate memory cell 100 during a successive stage of manufacture in which a hot standard clean one (hot SC1) etch is used to form indent 300 in select gate 104 adjacent to charge storage layer 108. A notch 302 is also formed in control gate 114. The hot SC1 etch is conventional in semiconductor processing. The dimensions of indent 300 depend on the size of select gate 104 and control gate 114. In some embodiments, indent 300 may be 50-200 Angstroms wide and 200-400 Angstroms high. Indent 300 can extend from 50-150 Angstroms below the top of charge storage layer 108 to nitride layer 106. The dimensions of notch 302 in control gate 114 also depend on the size of select gate 104 and control gate 114. In some embodiments, notch 302 may be 50-200 Angstroms wide and 50-150 Angstroms below the top of charge storage layer 108.

Other indents, such as indent 306 on the other sidewall of select gate 104 and indent 304 at an exposed bottom edge of control gate 114 can also be formed as a result of the SC1 etch process. The dimensions of indent 306 depend on the size of select gate 104. In some embodiments, indent 306 may be 50-200 Angstroms wide and 800 to 1200 Angstroms high. Indent 306 can extend from the top of gate dielectric layer 102 to the bottom of dielectric layer 106.

Figure 4:
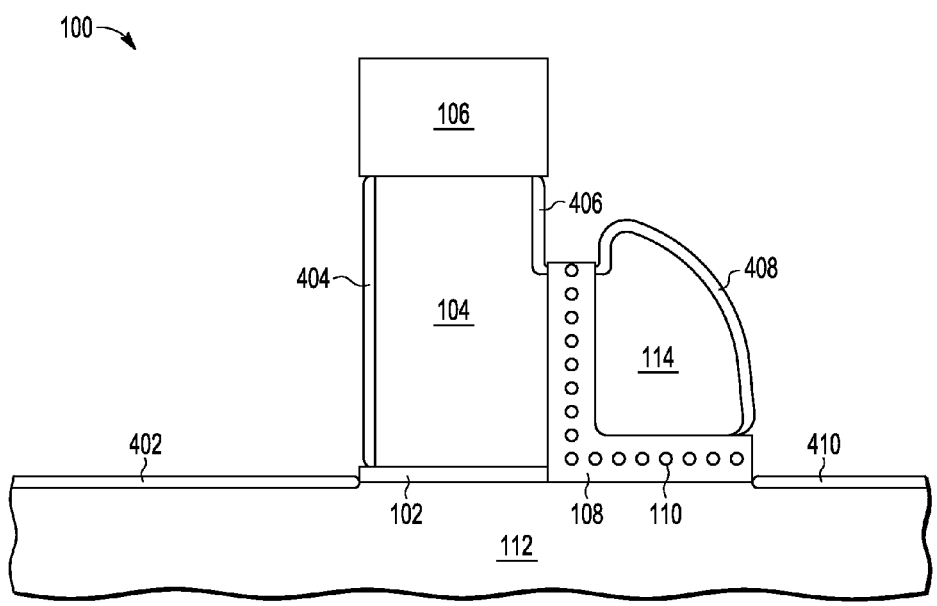

FIG. 4 shows a cross-sectional view of split gate memory cell 100 during a successive stage of manufacture in which oxide layers 402, 404, 406, 408, 410 are grown on exposed portions of substrate 112, and sidewalls of select gate 104 and control gate 114. In some embodiments, oxide layers 402-410 are furnace oxides that form at temperatures between 900-1100 degrees Centigrade. Other suitable oxides such as ISSG or Ozone oxides can be used. The thickness of oxide layers 402-410 can range from 20-50 Angstroms or other suitable thickness.

Figure 5:
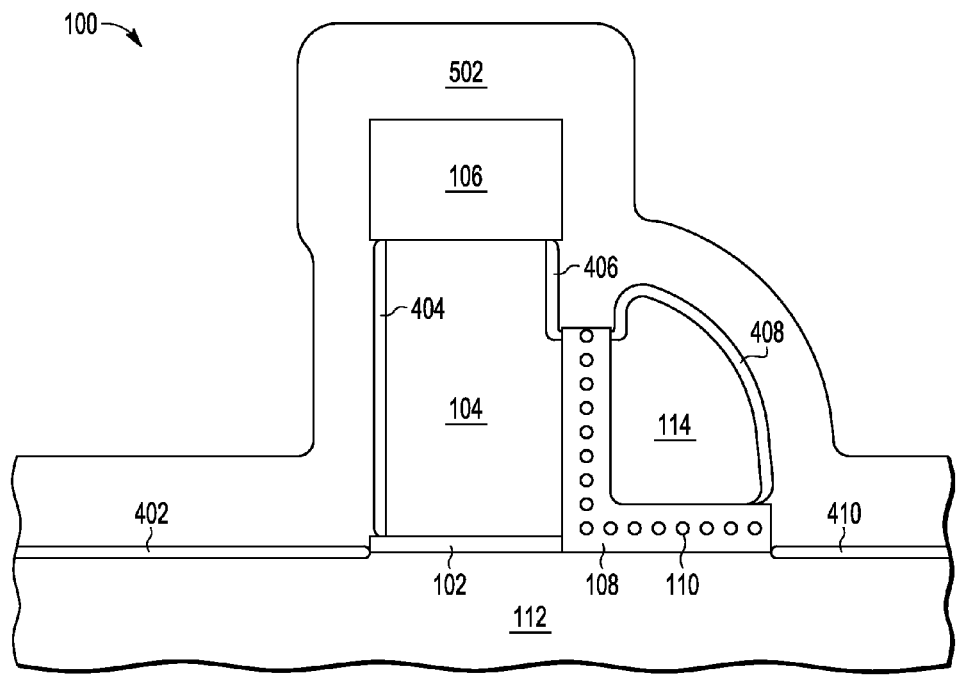

FIG. 5 shows a cross-sectional view of split gate memory cell 100 during a successive stage of manufacture in which oxide layer 502 is deposited over the exposed portions of memory cell 100. In some embodiments, oxide layer 502 can be high temperature oxide (HTO) or an oxynitride. Oxide layer 502 is annealed in a gas such as NO, N2O, O2 or N2 gas at 800-1000 degrees Centigrade. The thickness of oxide layer should be enough to fill indent 300 (FIG. 3) and therefore depends on the size of indent 300. In some embodiments, the thickness of oxide layer can range from 400-800 Angstroms, however, other suitable thicknesses can be used. Oxide layer 502 is nonconductive.

In other embodiments, oxide layer 502 can be formed before oxide layers 402, 404, 406, 408, 410 are grown.

Figure 6:
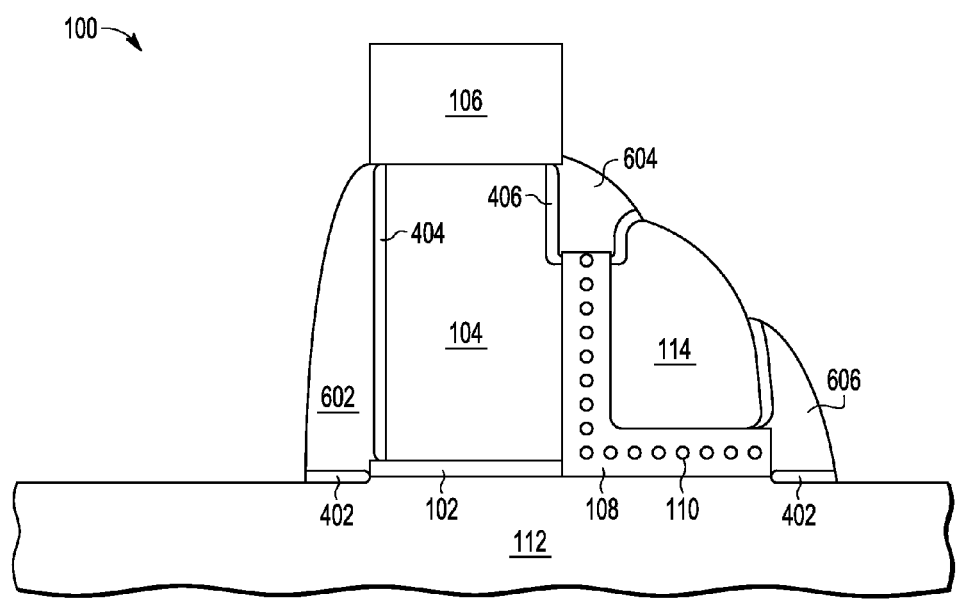

FIG. 6 shows a cross-sectional view of split gate memory cell 100 during a successive stage of manufacture in which spacers 602, 604, 606 are formed using an anisotropic etch. Spacer 602 is formed adjacent a sidewall of select gate 104 between grown oxide layer 402 and the bottom of dielectric layer 106. Spacer 604 is formed in indent 300 and notch 302 (FIG. 3). Spacer 606 is formed adjacent a lower portion of control gate 114 and extends from grown oxide layer 402 to an intermediate position along the height of control gate 114.

Figure 7:
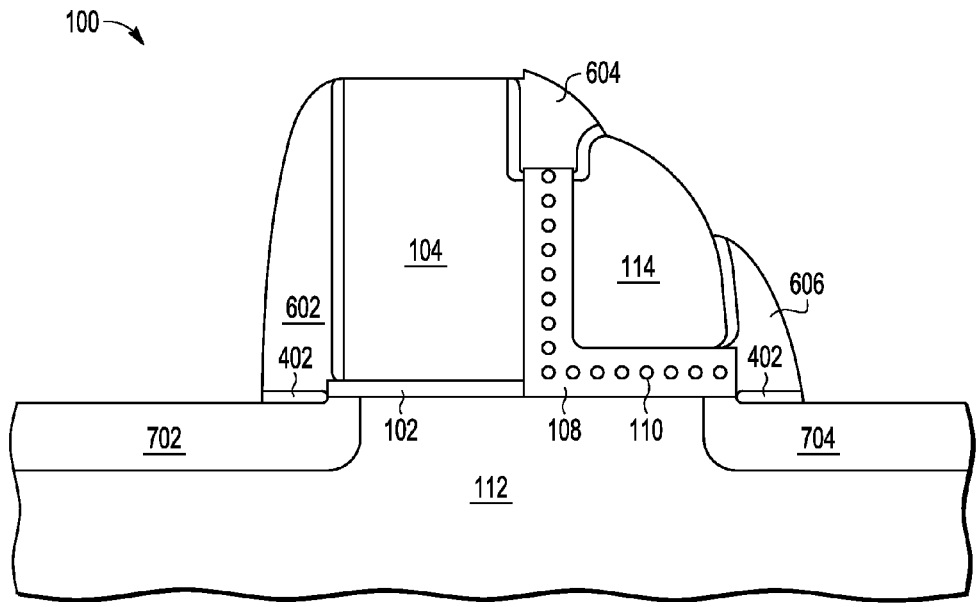

FIG. 7 shows a cross-sectional view of split gate memory cell 100 during a successive stage of manufacture in which nitride layer 106 (FIG. 1) is removed using a dry etch. Tilted implant processes using conventional ion implant can be performed to form drain region 702 in substrate 112 under a portion of select gate 104 and source region 704 in substrate 112 under a portion of control gate 114.

Figure 8:
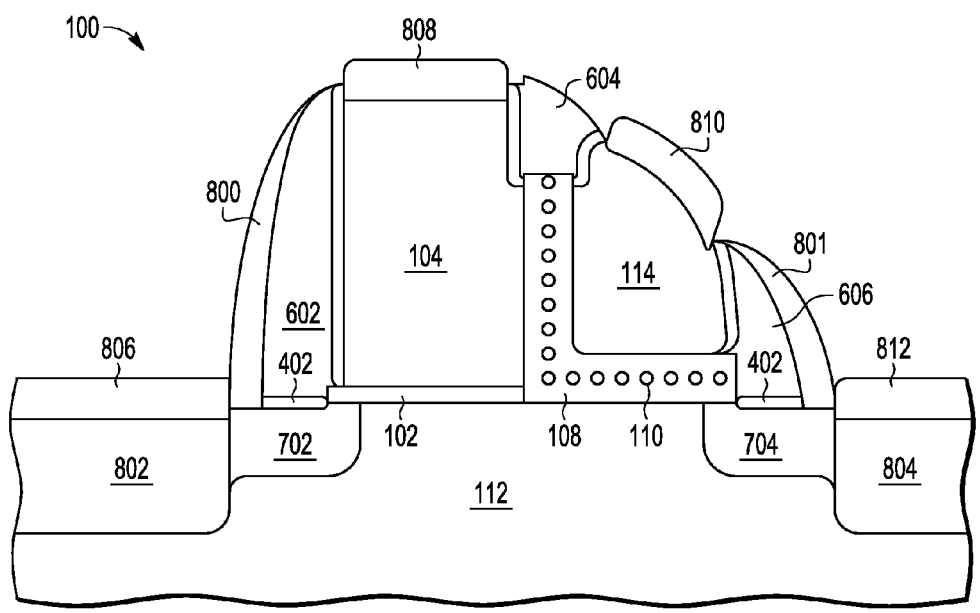

FIG. 8 shows a cross-sectional view of split gate memory cell 100 during a successive stage of manufacture in which spacers 800, 801 are formed adjacent respective spacers 602, 606 by a conventional process of depositing nitride and performing an anisotropic etch. Source/drain implants are made by conventional ion implant to form a source region 804 in semiconductor substrate 112 and a drain region 802 in semiconductor substrate 112.

A silicide contact 806, 808, 810, 812 is formed on the exposed surface of each of the source region 804, the drain region 802, the control gate 114 and the select gate 104 to make electrical contact to memory cell 100. In particular, silicide contact 812 is formed at an upper surface of source region 804 for making electrical contact to source region 804. Silicide contact 806 is formed at an upper surface of drain region 802 for making electrical contact to drain region 802. Silicide contact 808 is formed at an upper surface of select gate 104 for making electrical contact to select gate 104. Silicide contact 810 is formed at an upper surface of the control gate 114 for making electrical contact to the control gate 114.

Figure 9:
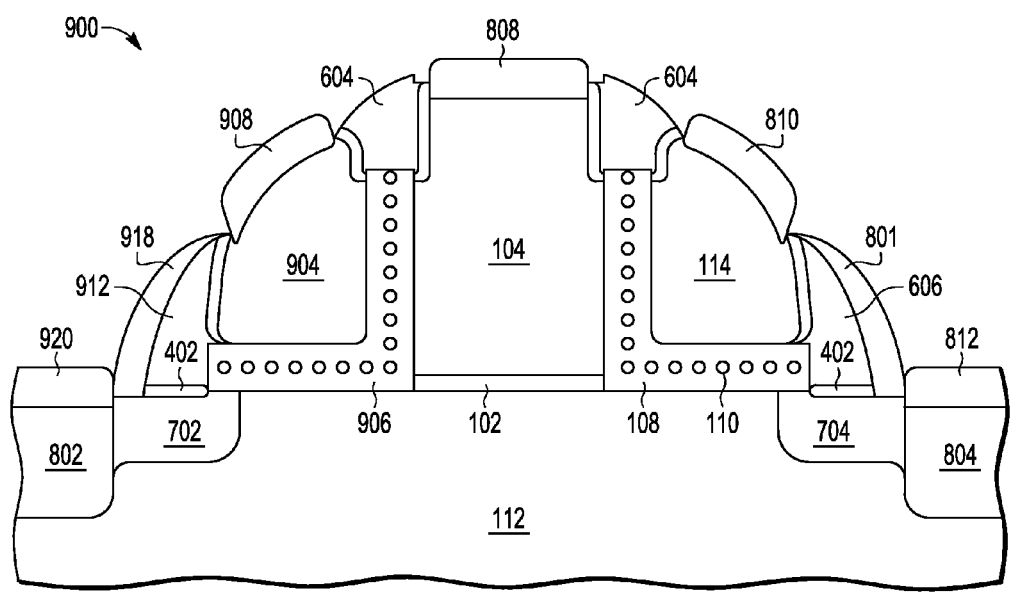
FIG. 9 shows a cross sectional side view of an embodiment of a multi-bit memory cell.

FIG. 9 shows a cross sectional side view of an embodiment of a multi-bit memory cell 900 that includes two control gates 114, 904 and one select gate 104. Drain region 702 is formed in substrate 112 under a portion of control gate 904 and under oxide layer 402 and spacer 918. Drain region 802 formed in substrate 112 adjacent drain region 702.

Memory cell 900 is shown with two bits, however, memory cells with more than two bits can be implemented with spacers 604 to prevent voltage breakdown between select gate 104 and control gates 904, 114. In addition to the features shown and described herein for FIGS. 1-8, memory cell 900 includes charge storage layer 906 instead of oxide layer (404) adjacent select gate 104.

Charge storage layer 906, spacers 918, 912, silicide regions 920, 908 and control gate 904 may be symmetric or have the same dimensions and performance characteristics as charge storage layer 108, spacers 606, 801, silicide regions 812, 810 and control gate 114. Alternatively, charge storage layer 906, spacers 918, 912, silicide regions 920, 908 and control gate 904 may have different dimensions and/or performance characteristics than charge storage layer 108, silicide regions 812, 810, spacers 606, 801, and control gate 114.

By now it should be appreciated that in some embodiments, a method for forming a split gate memory cell has been disclosed that can comprise forming a conductive gate layer 104 over a substrate 112, and forming a first sidewall of the conductive gate layer 104. The conductive gate layer 104 can be removed from over the substrate 112 in a first region laterally adjacent to the first sidewall. A layer of charge storage material 108-110 can be formed over the substrate 112 including along the first sidewall. A second gate structure 114 can be formed over the layer of charge storage material 108-110 and laterally adjacent the layer of charge storage material 108-110 located along the first sidewall. A portion of the charge storage layer located along the first sidewall can be removed to expose an upper portion of the first sidewall. A remaining portion of the charge storage layer along the lower sidewall remains after the removing. The upper portion of the first sidewall of the conductive gate layer 104 that is exposed can be etched. At least a portion of the lower portion of the first side wall remains after the etching. Dielectric material 406, 604 can be formed along the upper portion of the first sidewall that was etched and over the remaining portion of the charge storage layer located along the first sidewall. The first side wall can be part of a sidewall of a first gate structure 104 of the split gate memory cell and the second gate structure 114 is of the split gate memory cell.

In another aspect, the forming of the dielectric material 406, 604 can include oxidizing the upper portion of the first side wall.

In another aspect, the forming of the dielectric material 406, 604 can include depositing a layer of dielectric material 406, 604 over the wafer and then oxidizing the upper portion of the first side wall.

In another aspect, the dielectric material 406, 604 can include an oxide material 502 deposited at a peak deposition temperature of greater than 600 C.

In another aspect, the forming the dielectric material 406, 604 can include annealing the dielectric material 406, 604 at peak temperature of greater than 800 degrees Centigrade.

In another aspect, after the depositing the layer of dielectric material 406, 604, the deposited layer can be etched to form a side wall spacer 604 structure that is laterally adjacent to the first sidewall and located over the remaining portion of the layer of charge storage located along the first sidewall.

In another aspect, the etching the upper portion of the first sidewall of the conductive gate layer 104 can etch an upper portion of the lower portion of the first side wall that is located at a lower level than a top portion of the remaining portion of the charge storage layer located along to the first sidewall.

In another aspect, the etching the upper portion of the first sidewall of the conductive gate layer 104 can be performed with an etchant that also etches the second conductive gate structure 114.

In another aspect, the second conductive gate structure 114 can be etched such that a top portion of the remaining portion of the charge storage layer located along the first sidewall is a at higher level than a top portion of a portion 302 of the second gate structure 114 closest to the remaining portion of the charge storage layer.

In another aspect, the forming the second conductive gate structure 114 can include forming the second gate structure 114 such that the top of the second gate structure 114 is located below a top of the first conductive layer.

In another aspect, after forming the layer of conductive gate material, a separation layer 106 can be formed over the conductive gate layer 104. After the forming the first sidewall, the separation layer has a second sidewall that is aligned with the first sidewall, wherein the separation layer is removed after the forming the dielectric material 406, 604. The separation layer being of a material that has an etch selectivity with the dielectric material 406, 604 and the layer of conductive gate material.

In another aspect, the method can further include forming a second sidewall of the conductive gate layer 104, the second sidewall is on an opposite side of the gate structure from the first sidewall. The forming a layer of charge storage material 108-110 over the substrate 112 can include forming the layer of charge storage material 108-110 along the second sidewall. A third gate structure 904 can be formed over the layer of charge storage material 108-110 and laterally adjacent to the layer of charge storage material 108-110 located along the second sidewall. A portion of the charge storage layer laterally adjacent the second sidewall can be removed to expose an upper portion of the second sidewall. A remaining portion of the charge storage layer along a lower portion of the second sidewall remains after the removing. The upper portion of the second sidewall of the conductive gate layer 104 that is exposed can be etched. At least a portion of the lower portion of the second side wall remains after the etching. Dielectric material 902 can be formed along the upper portion of the second sidewall that was etched and over the remaining portion of the charge storage layer along the second side wall. The second side wall is part of a sidewall of the first gate structure 104 of a split gate memory cell and the third gate structure is of the split gate memory cell. The split gate memory cell can be a multi-bit memory cell.

In another embodiment, a split gate memory cell can comprise a substrate 112 including semiconductor material, a first gate structure 104 of the memory cell located over the substrate 112, the first gate structure 104 including a first side wall, the first side wall including a lower portion and an upper portion, the upper portion being inset 300 from the lower portion. The memory cell can further comprise a charge storage structure 108-110 of the memory cell located laterally to the first side wall, a second gate structure 114 located over the substrate 112 and over at least a portion of the charge storage structure 108-110, the second gate structure 114 being located laterally to the first gate structure 104 such that the first side wall is located between the first gate structure 104 and the second gate structure 114, a dielectric structure 406, 604 located against the upper portion of the first side wall and having a portion located over the lower portion of the first side wall.

In another aspect, the dielectric structure 604 can be located over the charge storage structure 108-110.

In another aspect, the charge storage structure 108-110 can include a first portion located between the first sidewall and the second gate structure 114, the dielectric structure 406, 604 is located over the first portion of the charge storage structure 108-110.

In another aspect, the top of the upper portion of the first sidewall can be higher than the top of the charge storage structure 108-110 and wherein the top of the lower portion of the first sidewall can be lower than the top of the charge storage structure 108-110.

In another aspect, the first gate structure 104 can be a select gate of the memory cell, the second gate structure 114 can be a control gate of the memory cell, the substrate 112 includes a source region 804, a drain region 802, and a channel region.

In another aspect, the first gate structure 104 includes a second side wall, the second side wall being on an opposite side of the first gate structure 104 to the first sidewall, the second side wall including a second lower portion and a second upper portion, the second upper portion being inset 300 from the second lower portion. The memory cell can further comprise a second charge storage structure 110 located laterally to the second side wall, a third gate structure 904 of the memory cell located over the substrate 112 and over at least a portion of the second charge storage structure 110, the third gate structure being located laterally to the first gate structure 104 such that the second side wall is located between the first gate structure 104 and the third gate structure 904. The dielectric structure 406, 604 can be located against the upper portion of the second side wall and have a portion located over the lower portion of the second side wall.

In other aspects, the second gate structure 114 can have an upper portion and a lower portion. A first gate side edge of the upper portion of the second gate structure 114 can be at a first distance from the first side wall and a first gate side edge of the lower portion of the second gate structure 114 can be at a second distance from the first sidewall. The first distance can be greater than the second distance.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a split gate memory cell, the method comprising:
    forming a conductive gate layer over a substrate;
    forming a first sidewall of the conductive gate layer, wherein the conductive gate layer is removed from over the substrate in a first region laterally adjacent to the first sidewall;
    forming a layer of charge storage material over the substrate including along the first sidewall;
    forming a second gate structure over the layer of charge storage material and laterally adjacent the layer of charge storage material located along the first sidewall;
    removing a portion of the charge storage layer located along the first sidewall to expose an upper portion of the first sidewall, wherein a remaining portion of the charge storage layer along the lower sidewall remains after the removing;
    etching the upper portion of the first sidewall of the conductive gate layer that is exposed, wherein at least a portion of the lower portion of the first side wall remains after the etching;
    forming dielectric material along the upper portion of the first sidewall that was etched and over the remaining portion of the charge storage layer located along the first sidewall, wherein the first side wall is part of a sidewall of a first gate structure of the split gate memory cell and the second gate structure is of the split gate memory cell.

2. The method of claim 1 wherein the forming the dielectric material includes oxidizing the upper portion of the first side wall.

3. The method of claim 1 wherein the forming the dielectric material includes depositing a layer of dielectric material over the wafer.

4. The method of claim 3 wherein the dielectric material includes an oxide material deposited at a peak deposition temperature of greater than 600 C.

5. The method of claim 3 wherein the forming the dielectric material include annealing the dielectric material at peak temperature of greater than 800 C.

6. The method of claim 3 wherein after the depositing the layer of dielectric material, etching the deposited layer to form a side wall spacer structure that is laterally adjacent to the first sidewall and located over the remaining portion of the layer of charge storage located along the first sidewall.

7. The method of claim 3 wherein the forming the dielectric material includes oxidizing the upper portion of the first side wall.

8. The method of claim 1 wherein the etching the upper portion of the first sidewall of the conductive gate layer etches an upper portion of the lower portion of the first side wall that is located at a lower level than a top portion of the remaining portion of the charge storage layer located along to the first sidewall.

9. The method of claim 1 wherein the etching the upper portion of the first sidewall of the conductive gate layer is performed with an etchant that also etches the second conductive gate structure.

10. The method of claim 1 wherein the second conductive gate structure is etched such that a top portion of the remaining portion of the charge storage layer located along the first sidewall is a at higher level than a top portion of a portion of the second gate structure closest to the remaining portion of the charge storage layer.

11. The method of claim 1 wherein the forming the second conductive gate structure includes forming the second gate structure such that the top of the second gate structure is located below a top of the first conductive layer.

12. The method of claim 1 wherein after forming the layer of conductive gate material, forming a separation layer over the conductive gate layer, wherein after the forming the first sidewall, the separation layer has a second sidewall that is aligned with the first sidewall, wherein the separation layer is removed after the forming the dielectric material, the separation layer being of a material that has an etch selectivity with the dielectric material and the layer of conductive gate material.

13. The method of claim 1 comprising:
    forming a second sidewall of the conductive gate layer, the second sidewall is on an opposite side of the gate structure from the first sidewall;
    wherein the forming a layer of charge storage material over the substrate includes forming the layer of charge storage material along the second sidewall;
    forming a third gate structure over the layer of charge storage material and laterally adjacent to the layer of charge storage material located along the second sidewall;
    removing a portion of the charge storage layer laterally adjacent the second sidewall to expose an upper portion of the second sidewall, wherein a remaining portion of the charge storage layer along a lower portion of the second sidewall remains after the removing;
    etching the upper portion of the second sidewall of the conductive gate layer that is exposed, wherein at least a portion of the lower portion of the second side wall remains after the etching;

forming dielectric material along the upper portion of the second sidewall that was etched and over the remaining portion of the charge storage layer along the second side wall, wherein the second side wall is part of a sidewall of the first gate structure of a split gate memory cell and the third gate structure is of the split gate memory cell, wherein the split gate memory cell is a multi-bit memory cell.

14. A split gate memory cell comprising:
a substrate including semiconductor material;
a first gate structure of the memory cell located over the substrate, the first gate structure including a first side wall, the first side wall including a lower portion and an upper portion, the upper portion being inset from the lower portion;
a charge storage structure of the memory cell located laterally to the first side wall;
a second gate structure located over the substrate and over at least a portion of the charge storage structure, the second gate structure being located laterally to the first gate structure such that the first side wall is located between the first gate structure and the second gate structure;
a dielectric structure located against the upper portion of the first side wall and having a portion located over the lower portion of the first side wall.

15. The memory cell of claim 14, wherein the dielectric structure is located over the charge storage structure.

16. The memory cell of claim 15 wherein the charge storage structure includes a first portion located between the first sidewall and the second gate structure, the dielectric structure is located over the first portion of the charge storage structure.

17. The memory cell of claim 16, wherein the top of the upper portion of the first sidewall is higher than the top of the charge storage structure and wherein the top of the lower portion of the first sidewall is lower than the top of the charge storage structure.

18. The memory cell of claim 14 wherein the first gate structure is a select gate of the memory cell, the second gate structure is a control gate of the memory cell, the substrate includes a source region, a drain region, and a channel region.

19. The memory cell of claim 14 wherein the first gate structure includes a second side wall, the second side wall being on an opposite side of the first gate structure to the first sidewall, the second side wall including a second lower portion and a second upper portion, the second upper portion being inset from the second lower portion, the memory cell comprising:
a second charge storage structure located laterally to the second side wall;
a third gate structure of the memory cell located over the substrate and over at least a portion of the second charge storage structure, the third gate structure being located laterally to the first gate structure such that the second side wall is located between the first gate structure and the third gate structure;
wherein the dielectric structure is located against the upper portion of the second side wall and having a portion located over the lower portion of the second side wall.

20. The memory cell of claim 14 wherein the second gate structure has an upper portion and a lower portion, wherein a first gate side edge of the upper portion of the second gate structure is at a first distance from the first side wall and a first gate side edge of the lower portion of the second gate structure is at a second distance from the first sidewall, wherein the first distance is greater than the second distance.

* * * * *